US005699024A

United States Patent [19]
Manlove et al.

[11] Patent Number: 5,699,024
[45] Date of Patent: Dec. 16, 1997

[54] ACCURATE INTEGRATED OSCILLATOR CIRCUIT

[75] Inventors: Gregory Jon Manlove; Mark Wendell Gose, both of Kokomo, Ind.

[73] Assignee: Delco Electronics Corporation, Kokomo, Ind.

[21] Appl. No.: 643,911

[22] Filed: May 6, 1996

[51] Int. Cl.[6] ...................................................... H03B 5/24
[52] U.S. Cl. ...................... 331/111; 331/113 R; 331/143; 331/176
[58] Field of Search ..................... 331/111, 176, 331/143, 113 R

[56] References Cited

U.S. PATENT DOCUMENTS

| 4,982,169 | 1/1991 | Wyman | 331/111 |
|---|---|---|---|
| 5,070,311 | 12/1991 | Nicolai | 331/111 |
| 5,084,685 | 1/1992 | Moeller et al. | 331/1 A |
| 5,093,633 | 3/1992 | Benhamida | 331/59 |
| 5,105,169 | 4/1992 | Yamazaki et al. | 331/34 X |
| 5,142,249 | 8/1992 | Hirotomi | 331/57 |
| 5,212,459 | 5/1993 | Ueda et al. | 331/111 |
| 5,311,150 | 5/1994 | Engbretson et al. | 331/59 |

Primary Examiner—Timothy P. Callahan
Assistant Examiner—An Luu
Attorney, Agent, or Firm—Jimmy L. Funke

[57] ABSTRACT

An accurate integrated oscillator circuit includes a first circuit generating a substantially temperature independent, or a linearly temperature dependent, reference current and a second circuit which is programmable to incrementally increase the reference current to a desired current level. A third circuit includes first and second capacitors and an oscillator output switchable between first and second output levels. The third circuit is responsive to a first charge value on the first capacitor, due to the reference current flowing therethrough, to switch the oscillator output to the first level while resetting the second capacitor to its uncharged state, and to a second charge value on the second capacitor, due to the reference current flowing therethrough, to switch the oscillator output to the second level while resetting the first capacitor to its uncharged state. The oscillator circuit is preferably formed of a single integrated circuit and has an adjustable center frequency.

25 Claims, 3 Drawing Sheets

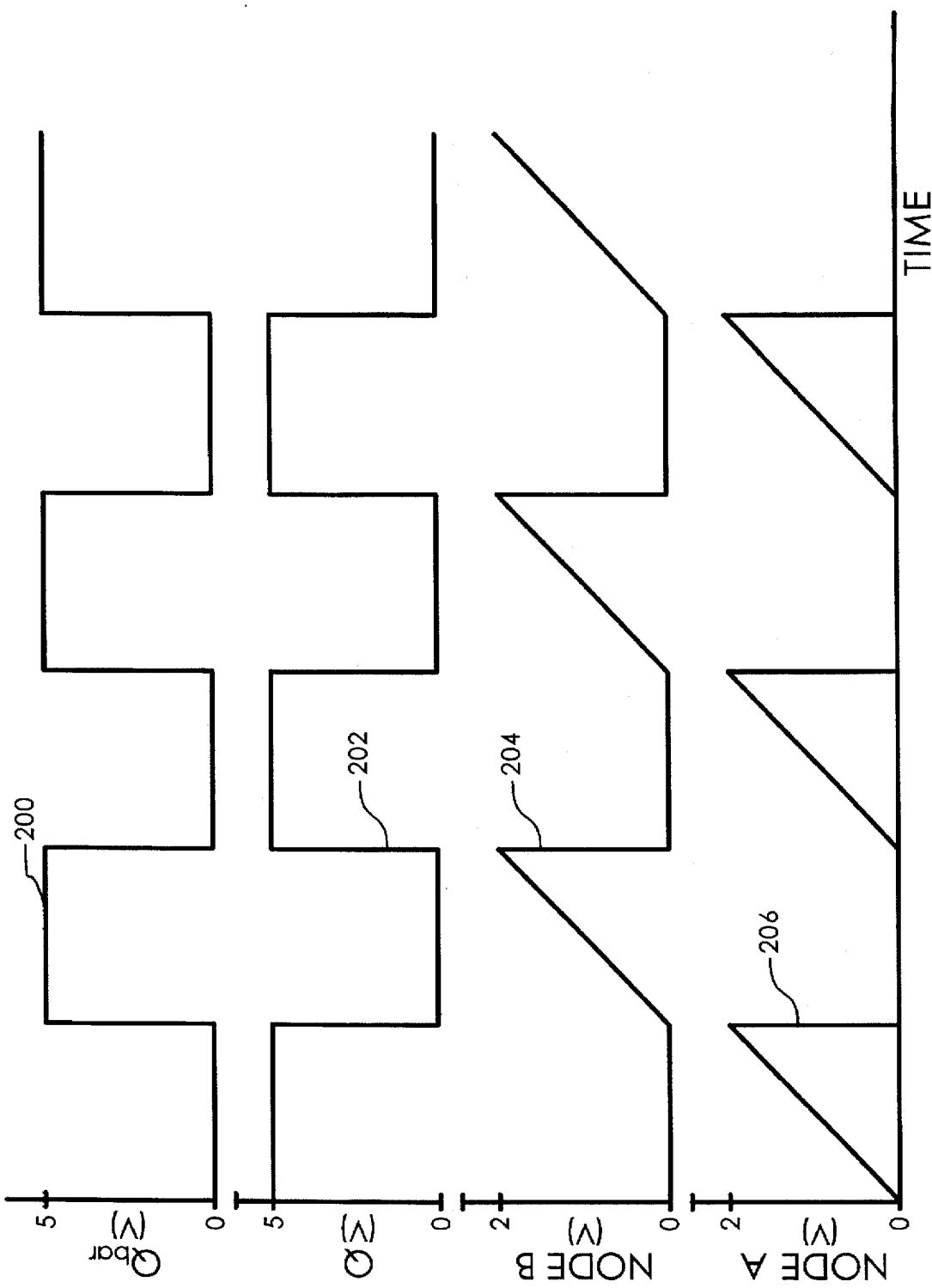

ACCURATE INTEGRATED OSCILLATOR CIRCUIT

FIELD OF THE INVENTION

The present invention relates generally to oscillator circuits, and more specifically to completely integrated oscillator circuits having accurate frequency operation.

BACKGROUND OF THE INVENTION

Many integrated circuits and electronic systems require a clock signal which is typically provided by some type of oscillator circuit. However, when such an oscillator circuit is fabricated as an integrated circuit, variations in process parameters and operating temperatures often make it difficult to provide for an accurate and stable operating frequency over a wide operating temperature range. Designers of oscillator circuits therefore typically rely on components external to the integrated circuit to achieve the desired accuracy and stability.

One example of a known oscillator circuit 10 using a resonator or crystal to achieve an accurate and stable operating frequency is shown in FIG. 1. Referring to FIG. 1, circuit 10 includes an inverter 12 having an input 14 and an output 16. A first capacitor 20 is connected between input 14 and ground potential, and a second capacitor 22 is connected between output 16 and ground potential. A resonator or crystal 18 is connected between input 14 and output 16 of inverter 12. The resonator or crystal 18 is a piezoelectric device which provides a high Q at resonance. In operation, the inverter 12 provides 180 degrees of phase shift, and the remainder of the phase shift is provided by capacitors 20 and 22. If the total phase shift is zero degrees, circuit 10 will oscillate. The high Q of the resonator or crystal 18 causes circuit 10 to generate an accurate frequency response. For example, with oscillator circuit 10, it is possible to develop frequencies with less than 1 percent error over a wide temperature range.

Although not shown in the drawings, a number of oscillator circuits are known which use external inductors and capacitors to achieve accurate center frequencies. Although such circuits can be implemented in various ways, they all use feedback to provide an oscillation at the LC resonant frequency. The Q of such a circuit is significantly less than that of circuit 10 due to the finite resistance of the inductor, but the basic operation of an LC oscillator is similar to that of oscillator circuit 10.

Referring now to FIG. 2, another known type of oscillator circuit 30, commonly known as an RC multivibrator oscillator, is shown. Circuit 30 includes a Schmitt trigger circuit 32 having an input 34 an output 36. Input 34 is connected to one end of a resistor 38, the opposite end being connected to a voltage supply, $V_S$, and to one end of a capacitor 40, the opposite end being connected to ground potential. The common connection of input 34 of Schmitt trigger circuit 32, resistor 38 and capacitor 40 defines a circuit node 42 having a voltage $V_{RC}$ thereat. Output 36 of Schmitt trigger circuit 32 defines an oscillator output, OUT, which is connected to a gate 44 of switch 46. Typically, switch 46 is a MOS transistor, although it may be a bipolar transistor or other known switch. One end 48 of switch 46 is connected to node 42, while the other end 50 is connected to one end of a second resistor 52. The opposite end of resistor 52 is connected to ground potential.

In describing the operation of circuit 30, it is assumed that OUT is initially low, and switch 46 is initially off (non-conducting). With such initial conditions, current drawn from voltage supply $V_S$ by resistor 38 begins to charge capacitor 40. When the charge on capacitor 40 reaches the upper threshold of the Schmitt trigger circuit 32, OUT switches high and closes switch 46. Preferably, resistor 52 is smaller than resistor 38, and, with switch 46 in a conducting state, the voltage $V_{RC}$ at node 42 ramps down until the lower threshold of the Schmitt trigger circuit 32 is reached. At this point, OUT switches low, thereby opening switch 46, and the process repeats itself.

Although the foregoing oscillator circuits are widely used, each circuit suffers from inherent drawbacks. For example, although the oscillator circuit 10 of FIG. 1. is very accurate, it is not fully integratable, and two external capacitors as well as an external resonator or capacitor are required. Further, resonators or crystals are relatively expensive, and occupy a large amount of circuit board area. Additionally, the integrated circuit containing inverter 12 requires two external signal pads. Such a requirement may be unacceptable in a small pin count package or a vary small integrated circuit.

While an LC oscillator is typically lower in cost than circuit 10 of FIG. 1, center frequency accuracy is lost. To achieve an accuracy of a few percent, the inductor typically requires a mechanical adjustment, which increases component and assembly cost. Further, the external inductors and capacitors occupy a large amount of circuit board space. Additionally, typical LC oscillator circuits require at least 1 external signal pad.

While the RC multivibrator oscillator circuit 30 of FIG. 2 may be easily integrated using integrated resistors and capacitors, it has a number of problems with frequency accuracy. First, integrated resistors exhibit some temperature dependencies which will directly impact the oscillator frequency accuracy. Second, the RC ratio of chip components varies widely. While such variances can be somewhat accounted for by calibrating the RC elements, switching resistor values is difficult due to the finite resistance of integrated switches. Third, the $V_{RC}$ input waveform to the Schmitt trigger circuit 32 exhibits an RC time constant, which generates non-linear timing errors due to linear offsets. Fourth, the matching of resistor 38 with resistor 52 is critical to the operation of circuit 30, and the resistance of switch 46 causes errors thereto. Further, since the Schmitt trigger circuit 32 has two reference thresholds, variations between the thresholds levels will cause oscillator variations. Moreover, the finite slew rate of the Schmitt trigger circuit 32 introduces further timing errors.

Due to the foregoing shortcomings of known oscillator circuits, a need exists for an accurate oscillator circuit that is completely integrated and that maintains accurate frequency operation over a wide operating temperature.

SUMMARY OF THE INVENTION

The foregoing shortcomings of prior art oscillator circuits are overcome by the oscillator circuit of the present invention. In accordance with one aspect of the present invention, a substantially temperature independent current is generated from a band-gap reference voltage. Alternatively, a current having a known temperature dependence is generated. In either case, the generated current is calibrated, preferably in accordance with a binary weighting scheme, to provide a reference current. The reference current is alternately directed through first and second capacitors while resetting the other capacitor to its uncharged state. Each capacitor is connected to an input of a comparator, and each comparator is referenced to a common reference voltage. Preferably, the comparator outputs are supplied to a flip-flop circuit from which the oscillator output is extracted.

One object of the present invention is to provide an accurate integrated oscillator circuit having low temperature drift.

Another object of the present invention is to combine a substantially temperature independent current source with a minimum timing uncertainty circuit to produce an integrated oscillator with an accurate center frequency over all process and temperature variations.

Yet another object of the present invention is to provide an accurate integrated oscillator having a known linear temperature dependent operating frequency.

Still another object of the present invention is to combine a current source having a known temperature dependency with a minimum timing uncertainty circuit to produce an integrated oscillator with an accurate temperature dependent center frequency over all process variations.

A further object of the present invention is to provide an accurate integrated oscillator circuit by alternately supplying a reference current to a pair of oscillating capacitors.

Yet a further object of the present invention is to provide such a reference current by applying a temperature independent current through a binary weighted array of transistors to calibrate the center frequency.

Still a further object of the present invention is to provide such a reference current by applying a current having a predetermined temperature dependency through a binary weighted array of transistors to calibrate the center frequency.

Another object of the present invention is to minimize inaccuracies in an oscillator circuit by utilizing a dual comparator arrangement referenced to a common reference voltage.

Yet another object of the present invention is to provide an accurate oscillator circuit requiring no external components or signal pads.

These and other objects of the present invention will become more apparent from the following description of the preferred embodiment.

BRIEF DESCRIPTION OF THE DRAWINGS

FIG. 4, which is comprised of FIGS. 4A–4D, is a waveform diagram illustrating operation of the oscillator circuit of FIG. 3.

DESCRIPTION OF THE PREFERRED EMBODIMENT

Figure 1:
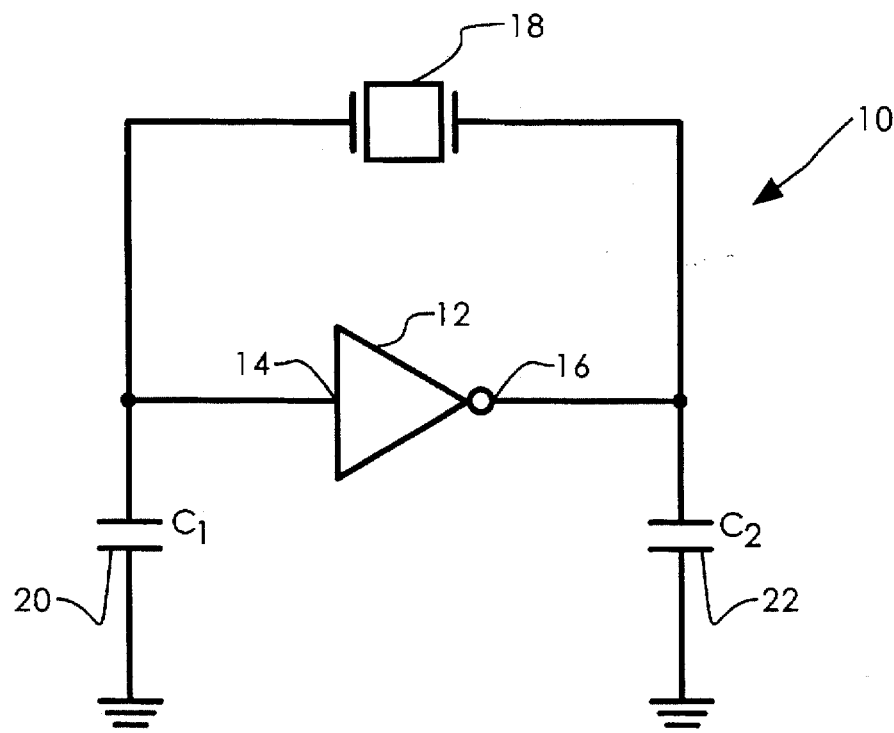
FIG. 1 is a schematic drawing a known oscillator circuit using a resonator or crystal.

For the purposes of promoting and understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices, and such further applications of the principles of the invention as illustrated therein being contemplated as would normally occur to one skilled in the art to which the invention relates.

Figure 3:
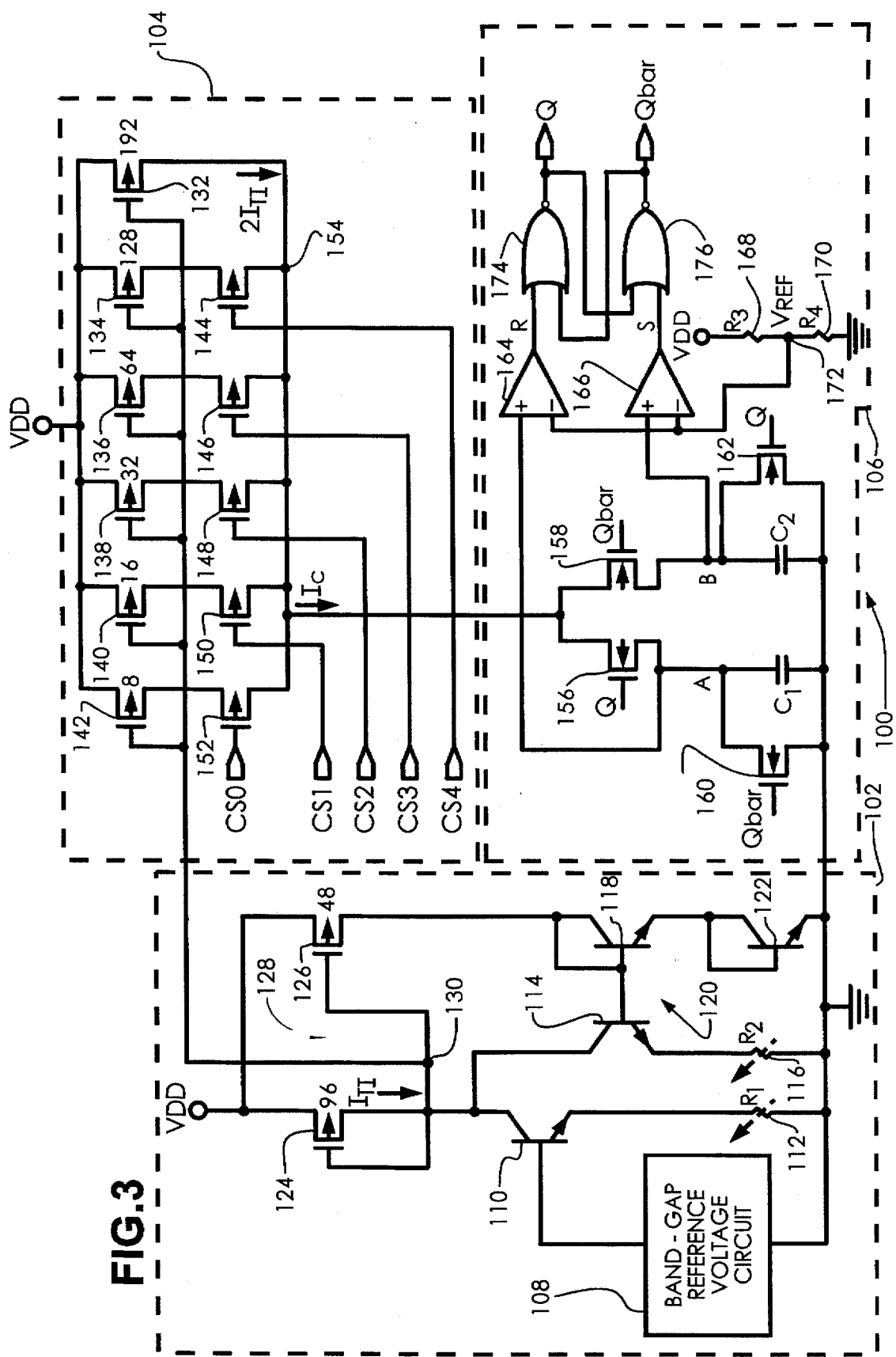
FIG. 3 is a schematic drawing of an accurate integrated oscillator circuit, in accordance with the present invention.

Referring now to FIG. 3, an accurate integrated oscillator circuit 100, in accordance with the present invention, is shown. To facilitate the description of oscillator circuit 100, it is partitioned into three sub-circuits; a current source circuit 102, a current calibration circuit 104, and a switching circuit 106. The preferred structure and operation of each of the circuit blocks 102–106 will be discussed separately.

Referring now to the current source circuit block 102, circuit block 108 preferably provides a constant and substantially temperature independent voltage to the base of an NPN transistor 110. Preferably, circuit block 108 is a known band-gap reference voltage circuit operable to provide a voltage to the base of transistor 110 equal to the band-gap voltage for the particular semiconductor fabrication process used, although the present invention contemplates that circuit block 108 may be any known circuit supplying a constant and substantially temperature independent voltage to the base of transistor 110. In a preferred semiconductor fabrication process for forming circuit 100 of the present invention, the band-gap voltage provided by circuit block 108 is approximately 1.3 volts.

The emitter of transistor 110 is connected to one end of a first resistor 112, the opposite end of which is connected to ground potential. The collector of transistor 110 is connected to a collector of an NPN transistor 114, and the emitter of transistor 114 is connected to one end of a second resistor 116, the opposite end of which is connected to ground potential. The base of transistor 114 is connected to the base and collector of an NPN transistor 118 such that transistors 114 and 118 form a current mirror 120. The emitter of transistor 118 is connected to the base and collector of an NPN transistor 122, the emitter of which is connected to ground potential.

The collectors of transistors 110 and 114 are connected to the gate and drain of p-channel MOS transistor 124, the source of which is connected to supply voltage VDD. The gate and drain of transistor 124 are further connected to the gate of a p-channel MOS transistor 126 to form a current mirror 128. The source of transistor 126 is connected to the source of transistor 124, and the drain of transistor 126 is connected to the base and collector of transistor 118. The collectors of transistors 110 and 114, the gate and drain of transistor 124, and the gate of transistor 126 define a circuit node 130. Preferably, the channel width of transistor 124 is sized to be twice as large as the channel width of transistor 126, and the channel width of transistor 126 is sized to be approximately 48 times as large as the minimum channel width of the fabrication process. Further, for a semiconductor fabrication process having a band-gap voltage of approximately 1.3 volts, resistor 112 is preferably set at approximately 31 kohms, and resistor 116 is set at approximately 68 kohms.

It is well known that the base-emitter voltage ($V_{be}$) of an NPN transistor exhibits a negative linear temperature dependency which, in a preferred process, is approximately −2 mV/°C. The current source circuit block 102 of the present invention preferably exploits this feature of the NPN transistor to provide a substantially constant current $I_{TT}$ over an operating range of between approximately −50° C. to 150° C.

In the operation of current source circuit block 102, a constant voltage is applied to the base of transistor 110 by band-gap reference voltage circuit 108. As previously discussed, the voltage provided to the base of transistor 110 is preferably a band-gap reference voltage of approximately 1.3 volts, although this voltage need only be sufficiently below supply voltage, VDD, to guarantee that transistor 110 does not saturate. The application of the band-gap reference voltage to the base of transistor 110 generates a temperature dependent voltage at the emitter of transistor 110 having a positive temperature dependency. As temperature increases, the voltage across resistor 112 increases, thereby increasing the current through transistor 110. The current through transistor 110 thus has a positive temperature dependency.

Transistors 118 and 122 are connected in series to generate a voltage at the base of transistor 118 of $2V_{be}$. Since this voltage is also applied to the base of transistor 114, the voltage across resistor 116 is therefore equal to $1V_{be}$. Since $V_{be}$ has a negative temperature dependency, the voltage across resistor 116 similarly has a negative temperature dependency which, in turn, causes the current through transistor 114 to have a negative temperature dependency. Since the current $I_{TT}$ is the sum of the currents flowing through transistors 110 and 114, the positive linear temperature dependent current through transistor 110 is summed with the negative linear temperature dependent current through transistor 114 to generate a current $I_{TT}$ at node 130 preferably having zero temperature dependency.

The magnitudes of the currents flowing through transistors 110 and 114 are controlled by the values of resistors 112 and 116 respectively. Values for resistors 112 and 116 can thus be chosen in accordance with the particular semiconductor fabrication process used and other design concerns to produce a desired $I_{TT}$ value. Further, as shown in phantom, resistors 112 and/or 116 may be optionally adjustable in accordance with known techniques, such as, for example, via a network of fusibly linked resistors, to account for variations in the bipolar fabrication process, variations in the band-gap reference voltage, and variations in the current densities of the NPN transistors. The current source circuit 102 can thus be optimized for any semiconductor fabrication process.

The present invention further contemplates applications of oscillator circuit 100 which require an output frequency having a known linear temperature dependency. Such a requirement may be easily accomplished with the circuitry 100 of the present invention by imparting a corresponding linear temperature dependency to the current $I_{TT}$. Since the current $I_{TT}$ is the sum of the positive linear temperature dependent current through transistor 110 and the negative linear temperature dependent current through transistor 114, the current $I_{TT}$ can be made to have a positive linear temperature dependency by decreasing the value of resistor 112, or a negative linear temperature dependency by decreasing the value of resistor 116. If the current $I_{TT}$ has a positive linear temperature dependence, then the frequency of the oscillator circuit output will similarly have a positive linear temperature dependence. Conversely, if the current $I_{TT}$ has a negative linear temperature dependence, then the frequency of the oscillator circuit output will likewise have a negative linear temperature dependence. Those skilled in the art will recognize, however, that any known circuit for producing a current having a desired temperature dependence, whether it be linear or non-linear, can be used in place of circuit block 102 to suit the particular application.

Referring now to the current calibration circuit block 104, node 130 of current source circuit 102 is connected to the gates of p-channel MOS transistors 132–142. The source of each of the transistors 132–142 are connected to supply voltage, VDD. Since the gate and drain of transistor 124 are connected together, transistor 124 thus forms a current mirror with each of the transistors 132–142. The drain of transistor 134 is connected to the source of a p-channel MOS transistor 144, the drain of transistor 136 is connected to the source of a p-channel MOS transistor 146, the drain of transistor 138 is connected to the source of a p-channel MOS transistor 148, the drain of transistor 140 is connected to the source of a p-channel MOS transistor 150, and the drain of transistor 142 is connected to the source of a p-channel MOS transistor 152. The gate of transistor 152 defines a control input CS0, the gate of transistor 150 defines a control input CS1, the gate of transistor 148 defines a control input CS2, the gate of transistor 146 defines a control input CS3, and the gate of transistor 144 defines a control input CS4. The drains of transistors 132 and 144–152 are connected together to form a circuit node 154.

Since the current $I_{TT}$ through transistor 124 has a predetermined temperature dependency (or temperature independency), the currents produced at the drains of each of the transistors 132–142 have an identical temperature dependency. Preferably, the channel width of transistor 132 is sized to be twice as large as the channel width of transistor 124 so that the current produced at the drain of transistor 132 is equal to $2I_{TT}$. Transistors 144–152 are used as switches to selectively permit currents provided by transistors 134–142 to flow to node 154, depending upon the level of the control signals at inputs CS0–CS4. Thus, if control inputs CS0–CS4 are all logic high, transistors 144–152 will all be non-conducting and the current $I_C$ provided to node 154 will be a minimum valve of $2I_{TT}$. Conversely, if the control signals at control inputs CS0–CS4 are all logic low, the current $I_C$ supplied to node 154 will be a maximum value of $2I_{TT}$ plus the currents contributed by each of the transistors 134–142. The control signals at control inputs CS0–CS4 may thus be individually controlled, or programmed, to provide for a current $I_C$ supplied to node 54 equal to $2I_{TT}$ plus currents contributed by any of transistors 134–142. In this manner, the current $I_C$ provided to node 154 is an incrementally increased representation of the current $I_{TT}$. By so calibrating $I_C$, variations in the nominal oscillator center frequency due to semiconductor fabrication process variations can be compensated for.

Preferably, the channel widths of transistors 134–142 are designed to be binary weighted, thereby causing the drain currents of these devices to be similarly binary weighted. Transistor 134 is therefore designed to provide a current of $4I_{TT}/3$, transistor 136 is designed to supply a current of $2I_{TT}/3$, transistor 138 is designed to provide a current of $I_{TT}/3$, transistor 140 is designed to provide a current of $I_{TT}/6$, and transistor 142 is designed to provide a current of $I_{TT}/12$. By appropriately controlling the input signals to control signal inputs CS0–CS4, current calibration circuit 104 can be programmed to provide a current $I_C$ to node 154 of between $2I_{TT}$ and $55I_{TT}/12$ in accordance with a binary weighting scheme. It is to be understood that although the foregoing binary weighting scheme is preferable for use with the present invention, those skilled in the art will recognize that any desired weighting scheme can be used to calibrate the current Ic provided by current calibration current 104.

Referring now to the switching circuit block 106, node 154 of current calibration circuit 104 is connected to the drains of n-channel MOS transistors 156 and 158. The gates of transistors 156 and 158 are connected to the Q and Qbar outputs respectfully of switching circuit 106. The source of transistor 156 is connected to one end of a capacitor C1, the opposite end of which is connected to ground potential. Similarly, the source of transistor 158 is connected to one end of a second capacitor C2, the opposite end of which is connected to ground potential. The source of transistor 156 is also connected to the drain of an n-channel MOS transistor 160 which has a gate connected to Qbar and a source connected to ground potential. The source of transistor 158 is further connected to the drain of an n-channel MOS transistor 162 which has a base connected to Q and a source connected to ground potential. The common connection of the source of transistor 156, the drain of transistor 160, and capacitor C1 defines a circuit node A, and the common connection of the source of transistor 158, the drain of transistor 162, and capacitor C2 defines a circuit node B.

Circuit node A is connected to a non-inverting input of a comparator 164, and circuit node B is connected to the non-inverting input of a comparator 166. The inverting inputs of comparators 164 and 166 are both connected to one end of a third resistor 168 and one end of a fourth resistor 170. The opposite end of resistor 168 is connected to supply voltage VDD, and the opposite end of transistor 170 is connected to ground potential. The common connection of the inverting inputs of comparators 164 and 166, and the resistors 168 and 170 define a circuit node 172 having a voltage $V_{REF}$ thereat.

Preferably, the outputs of comparators of 164 and 166 are connected to a data latching circuit, which, in one embodiment, is an RS flip-flop. As is known in the art, an RS flip-flop may be constructed from NOR gates 174 and 176. Specifically, the output of comparator 164 comprises the R input to NOR gate 174 and the output of comparator 166 comprises the S input of NOR gate 176. The output of NOR gate 174 is the Q output of switching circuit 106, and is connected to the remaining input to NOR gate 176, and the output of NOR gate 176 is the Qbar output of switching circuit 106, and is connected to the remaining input to NOR gate 174. In accordance with the present invention, either the Q or Qbar outputs of switching circuit 106 may be used as the oscillator output of oscillator circuit 100. Further, circuit 100 is preferably formed of a single integrated circuit in accordance with a semiconductor fabrication process capable of incorporating bipolar and MOS transistors such as, for example, a so-called bi-CMOS process.

With the aid of FIGS. 4A-4D, the operation of switching circuit 106 will now be described in detail. For the purposes of the following description, it is assumed that the Q output 202 (FIG. 4B) is initially high (5 volts). With Q 202 high, transistor 156 turns on and supplies the current $I_C$ to capacitor C1. At the same time, transistor 162 turns on and pulls node B 204 (FIG. 4C) to ground potential, thereby resetting capacitor C2 to its uncharged state. Since Qbar 200 (FIG. 4A) is low, transistors 158 and 160 are off (non-conducting). With the current $I_C$ supplied only to capacitor C1, the voltage at node A 206 (FIG. 4D) at a rate of $I_C/C1$. When the voltage at node A 206 reaches the comparator reference voltage, $V_{REF}$, the output of comparator 164 goes high, which pulls Q 202 low. When Q 200 goes low, Qbar 200 goes high so that transistors 156 and 162 turn off (non-conducting) and transistors 158 and 160 turn on. The current $I_C$ is thus applied only to capacitor C2 while transistor 160 pulls node A 206 to ground potential, thereby resetting capacitor C1 to its uncharged state. The voltage at node B 204 increases at a rate of $I_C/C2$, until the voltage at node B 204 reaches the comparator reference voltage, $V_{REF}$. At this point, the output of comparator 166 goes high, which pulls Qbar 200 low and forces Q 202 high. The foregoing process repeats and an oscillation is produced at Q 202 and Qbar 200.

In one embodiment, capacitors C1 and C2 are each approximately 5 pF, and resistors 168 and 170 are approximately 30 kohms and 20 kohms respectfully so that the voltage $V_{REF}$ is approximately two volts (with VDD=5 volts) as shown in FIGS. 4C and 4D. Such an arrangement produces a square-wave oscillator output at Q 202 and Qbar 200 having a 50 percent duty cycle. However, the present invention contemplates providing any desired duty cycle. Preferably, this may be accomplished by choosing appropriate valves for C1 and C2 rather than providing comparators 164 and 166 with separate reference voltages. In this manner, timing uncertainties due to the separate comparator switching points are minimized. Since integrated capacitors tend to provide consistent operation over temperature, and since such capacitors can be accurately ratioed, particularly in CMOS processes, errors in circuit operation are thereby minimized.

Figure 2:
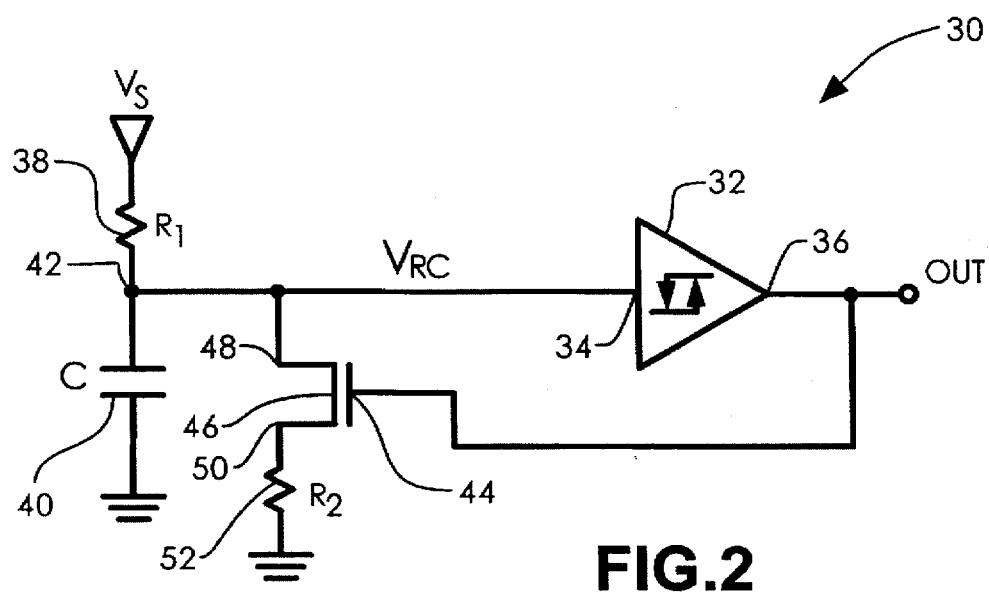
FIG. 2 is a schematic drawing a known RC multivibrator oscillator circuit.

It should now be appreciated that, in one embodiment of the present invention, a temperature independent current source coupled with a minimum timing uncertainty circuit produces an integrated circuit oscillator with an accurate center frequency over all process and temperature variations. In another embodiment, a current source having a known temperature dependence coupled with a minimum timing uncertainty circuit produces an integrated circuit oscillator with a known linearly temperature dependent center frequency over all process variations. Such a circuit is advantageous for at least several reasons. First, such a circuit requires no external components or signal pads to achieve frequency accuracy heretofore achievable only with expensive external components. Second, since the entirety of circuit 100 is preferably formed on a single integrated circuit, circuit reliability is thereby increased and circuit board area is conserved. Third, a reference current having a predetermined temperature dependence (or independence) is produced on chip which is applied to the oscillator capacitors through a binary weighted array of transistors so that the center frequency of the oscillator output may be accurately calibrated. Fourth, the use of two capacitors for oscillation eliminates the need for two current sources to be switched. Since capacitors can be nearly identically matched on an integrated circuit, circuit errors are minimized since the same current $I_C$ is switched between two capacitors. Fifth, inaccuracies associated with the delta voltage in a Schmitt trigger circuit, such as that described with reference to FIG. 2, are minimized by using the same reference voltage $V_{REF}$ for both comparators 164 and 166. Moreover, by using two capacitors, where one capacitor is completed reset to its uncharged state while the second capacitor is charging, timing uncertainties due to switching of the comparators and switching of the current $I_C$ are minimized. Other advantages of the present invention will be apparent to those skilled in the art.

The present invention is illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. An oscillator circuit comprising:

means for generating a reference current;

a current calibration circuit receiving said reference current and having a number of control inputs thereto, said current calibration circuit responsive to control signals at said number of control inputs to provide a control current as an incrementally increased representation of said reference current;

first and second capacitors; and a switching circuit coupled to each of said capacitors and having an oscillator output, said switching circuit responsive to a first output level at said oscillator output to direct said control current through said first capacitor only and switch said oscillator output to a second level when said first capacitor charges to a first charge value, and to said second oscillator output level to direct said control current through said second capacitor only and switch said oscillator output to said first output level when said second capacitor charges to a second charge value.

2. The oscillator circuit of claim 1 wherein said means for generating a reference current includes means for generating a substantially temperature independent current and providing said temperature independent current as said reference current.

3. The oscillator circuit of claim 2 wherein said current calibration circuit provides said control current as an incrementally increased representation of said temperature independent current in accordance with a binary weighting scheme.

4. The oscillator circuit of claim 2 wherein said means for generating a substantially temperature independent current is a current generation circuit operable to generate said temperature independent current from a band-gap reference voltage.

5. The oscillator circuit of claim 1 wherein said means for generating a reference current includes means for generating a linearly temperature dependent current and providing said linearly temperature dependent current as said reference current.

6. The oscillator circuit of claim 5 wherein said current calibration circuit provides said control current as an incrementally increased representation of said linearly temperature dependent current in accordance with a binary weighting scheme.

7. The oscillator circuit of claim 1 wherein said switching circuit includes:

a first comparator having a reference input, a signal input connected to said first capacitor and an output; and a second comparator having a reference input, a signal input connected to said second capacitor and an output, said reference inputs of each of said first and second comparators connected to a common reference voltage.

8. The oscillator circuit of claim 7 wherein said oscillator circuit further includes a flip-flop circuit having a first input connected to one of said first and second comparator outputs, a second input connected to the other of said first and second comparator outputs, a non-inverting output and an inverting output, said oscillator output corresponding to one of said non-inverting and inverting flip-flop outputs.

9. The oscillator circuit of claim 1 wherein said first charge value is equal to said second charge value.

10. In a circuit having first and second capacitors and a circuit output switchable between first and second output levels, a method of generating a periodic signal, the method comprising the steps of:

generating a reference current;

providing a control current as a programmable multiple of said reference current;

directing said control current through the first capacitor and resetting the second capacitor to its uncharged state while the circuit output is at the first output level;

switching the circuit output to the second output level when said control current charges the first capacitor to a first charge value;

directing said control current through the second capacitor and resetting the first capacitor to its unchanged state while the circuit output is at the second output level; and switching the circuit output to the first output level when said control current charges the second capacitor to a second charge value.

11. The method of claim 10 wherein the step of generating a reference current includes the step of generating a substantially temperature independent current and providing said substantially temperature independent current as said reference current.

12. The method of claim 11 wherein the step of providing said control current as a programmable multiple of said temperature independent current includes incrementally increasing said temperature independent current to a desired value in accordance with a binary weighting scheme.

13. The method of claim 10 wherein the step of generating a reference current includes the step of generating a linearly temperature dependent current and providing said linearly temperature dependent current as said reference current.

14. The method of claim 13 wherein the step of providing said control current as a programmable multiple of said linearly temperature dependent current includes incrementally increasing said linearly temperature dependent current to a desired value in accordance with a binary weighting scheme.

15. The oscillator circuit of claim 10 wherein said first charge value is equal to said second charge value.

16. An oscillator circuit formed of a single integrated circuit comprising:

a first circuit generating a reference current;

a current calibration circuit receiving said reference current and having a number of control inputs thereto, said current calibration circuit responsive to control signals at said number of control inputs to provide a control current as an incrementally increased representation of said reference current;

a second circuit alternately directing said control current through first and second capacitors while resetting the other of said first and second capacitors to its uncharged state; and a third circuit having an oscillator output switchable between first and second output levels, said third circuit responsive to a first charge value on said first capacitor to switch said oscillator output to said first level and to a second charge level on said second capacitor to switch said oscillator output to said second level.

17. The oscillator circuit of claim 16 wherein said first circuit includes a current generation circuit operable to generate a substantially temperature independent current from a band-gap reference voltage and provide said temperature independent current as said reference current.

18. The oscillator circuit of claim 17 wherein said current calibration circuit provides said control current as an incrementally increased representation of said temperature independent current in accordance with a binary weighting scheme.

19. The oscillator circuit of claim 16 wherein said first circuit includes a current generation circuit operable to generate a linearly temperature dependent current from a band-gap reference voltage and provide said linearly temperature dependent current as said reference current.

20. The oscillator circuit of claim 19 wherein said current calibration circuit provides said control current as an incrementally increased representation of said linearly temperature dependent current in accordance with a binary weighting scheme.

21. The oscillator circuit of claim 16 wherein said second circuit includes:

a first switching device connected in series with said control current and said first capacitor, and having an input connected to said oscillator output; and a second switching device connected in series with said control current and said second capacitor, and having an input connected to an inverted representation of said oscillator output, said first and second switching devices each responsive to one of said first and second levels at its input to permit said control current to flow therethrough to a corresponding one of said first and second capacitors.

22. The oscillator circuit of claim 21 wherein said second circuit further includes:

a third switching device connected in parallel with said first capacitor and having an input connected to said inverted representation of said oscillator output; and a fourth switching device connected in parallel with said second capacitor and having an input connected to said oscillator output, said third and fourth switching devices each responsive to one of said first and second output levels at its input to direct current away from a corresponding one of said first and second capacitors.

23. An oscillator circuit formed of a single integrated circuit comprising:

a first circuit generating a reference current;

a second circuit alternately directing said reference current through first and second capacitors while resetting the other of said first and second capacitors to its unchanged state;

a third circuit having an oscillator output switchable between first and second output levels, said third circuit responsive to a first charge value on said first capacitor to switch said oscillator output to said first level and to a second charge level on said second capacitor to switch said oscillator output to said second level;

a first comparator having a reference input, a signal input connected to said first capacitor and an output; and a second comparator having a reference input, a signal input connected to said second capacitor and an output, said reference inputs of each of said first and second comparators connected to a common reference voltage.

24. The oscillator circuit of claim 23 wherein said oscillator circuit further includes a flip-flop circuit having a first input connected to one of said first and second comparator outputs, a second input connected to the other of said first and second comparator outputs, a non-inverting output and an inverting output, said oscillator output corresponding to one of said non-inverting and inverting flip-flop outputs.

25. The oscillator circuit of claim 23 wherein said first charge value is equal to said second charge value.

* * * * *